(12) United States Patent
Murano et al.

(10) Patent No.: US 8,012,858 B2
(45) Date of Patent: Sep. 6, 2011

(54) METHOD OF FABRICATING SEMICONDUCTOR DEVICE

(75) Inventors: Masahiko Murano, Kanagawa (JP); Ichiro Mizushima, Kanagawa (JP); Tsutomu Sato, Oita (JP); Shinji Mori, Kanagawa (JP); Shuji Katsui, New York, NY (US); Hiroshi Itokawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 60 days.

(21) Appl. No.: 12/560,265

(22) Filed: Sep. 15, 2009

(65) Prior Publication Data
US 2010/0099241 A1    Apr. 22, 2010

(30) Foreign Application Priority Data
Oct. 21, 2008    (JP) .................................. 2008-270618

(51) Int. Cl.
*H01L 21/20*    (2006.01)
(52) U.S. Cl. ................................ 438/478; 257/E21.013
(58) Field of Classification Search .................. 257/301, 257/327, E21.09, E21.011, E21.013; 438/478, 438/300, 342, 222, 269, 341, 481
See application file for complete search history.

(56) References Cited

U.S. PATENT DOCUMENTS

| | | | |
|---|---|---|---|
| 6,342,421 | B1 | 1/2002 | Mitani et al. |
| 6,924,518 | B2 | 8/2005 | Iinuma et al. |
| 7,407,860 | B2 | 8/2008 | Kim et al. |
| 2004/0071876 | A1* | 4/2004 | Rakhimov et al. ......... 427/249.8 |
| 2004/0266142 | A1* | 12/2004 | Tillack et al. ................ 438/478 |
| 2005/0077570 | A1* | 4/2005 | Nishinohara ................ 257/336 |
| 2005/0079691 | A1* | 4/2005 | Kim et al. .................... 438/481 |
| 2008/0237732 | A1 | 10/2008 | Mori et al. |
| 2009/0011570 | A1 | 1/2009 | Mizushima et al. |

FOREIGN PATENT DOCUMENTS
JP    2000-277529    10/2000

OTHER PUBLICATIONS

Mizushima, I. et al., "Method of Fabricating Semiconductor Device," U.S. Appl. No. 12/401,453, filed Mar. 10, 2009.
Cheng, P. L. et al., "Effective Surface Treatments for Selective Epitaxial SiGe Growth in Locally Strained pMOSFETs," Semicond. Sci. Technol., vol. 22, pp, S140-S143, (2007).
Sato, S. et al., "Defects Induced by Carbon Contamination in Low-Temperature Epitaxial Silicon Films Grown with Monosilane," Japanese Journal of Applied Physics, vol. 44, No. 3, pp. 1169-1173, (2005).

* cited by examiner

*Primary Examiner* — Thomas L Dickey
*Assistant Examiner* — Nikolay Yushin
(74) *Attorney, Agent, or Firm* — Finnegan, Henderson, Farabow, Garrett & Dunner, L.L.P.

(57) ABSTRACT

A method of fabricating a semiconductor device according to one embodiment includes: removing a native oxide film and adhering silicon nitrides on an area of a Si based substrate in hydrogen gas atmosphere under a condition in which a pressure is a first pressure and a temperature is a first temperature, a silicon nitride-containing member being formed on the Si based substrate, the area being a area not covered by the member; lowering the temperature to a second temperature from the first temperature while maintaining the pressure at the first pressure in hydrogen gas atmosphere; lowering the pressure to a second pressure from the first pressure while maintaining the temperature at the second temperature in hydrogen gas atmosphere; and epitaxially growing a crystal on the area of the Si based substrate in a precursor gas atmosphere after the pressure is lowered to the second pressure, the crystal including at least one of Si and Ge, the precursor gas atmosphere including at least one of hydrogen, Si and Ge.

20 Claims, 11 Drawing Sheets

METHOD OF FABRICATING SEMICONDUCTOR DEVICE

CROSS-REFERENCE TO RELATED APPLICATIONS

This application is based upon and claims the benefit of priority from prior Japanese Patent Application No. 2008-270618, filed on Oct. 21, 2008, the entire contents of which are incorporated herein by reference.

BACKGROUND

In recent years, a technique to epitaxially grow a Si-based crystal such as a SiGe crystal, etc., on a Si-based substrate or a Si-based crystal layer is often used for fabricating a semiconductor device.

For example, in a technique described in JP-A-2006-13428, by epitaxially growing a SiGe crystal having a lattice constant larger than that of a Si crystal at a position sandwiching a channel region of a p-type transistor, a compressive stress is generated in the channel region and thereby straining the channel region. As a result, it is possible to improve carrier (hole) mobility in the channel region, thereby improving an operating speed of the p-type transistor.

Moreover, in the fabricating method of the SiGe based bipolar transistor, there is a well known technique to epitaxially grow a SiGe crystal after removal of a native oxide film on a Si substrate in a hydrogen gas atmosphere. The technique is, for example, described in JP-A-2006-13428. According to this technique, it is possible to grow SiGe crystal with good crystallinity on the Si substrate.

However, at the stage of growing the SiGe crystal, when there are comparatively a lot of members made of silicon nitride such as a mask material etc. on the Si substrate, silicon nitrides dispersed from the material may adhere to area used for a base of growth of the SiGe crystal on the Si substrate, which may disturb the growth of the SiGe crystal with good crystallinity.

BRIEF SUMMARY

A method of fabricating a semiconductor device according to one embodiment includes: removing a native oxide film and adhering silicon nitrides on an area of a Si based substrate in hydrogen gas atmosphere under a condition in which a pressure is a first pressure and a temperature is a first temperature, a silicon nitride-containing member being formed on the Si based substrate, the area being a area not covered by the member; lowering the temperature to a second temperature from the first temperature while maintaining the pressure at the first pressure in hydrogen gas atmosphere; lowering the pressure to a second pressure from the first pressure while maintaining the temperature at the second temperature in hydrogen gas atmosphere; and epitaxially growing a crystal on the area of the Si based substrate in a precursor gas atmosphere after the pressure is lowered to the second pressure, the crystal including at least one of Si and Ge, the precursor gas atmosphere including at least one of hydrogen, Si and Ge.

A method of fabricating a semiconductor device according to another embodiment includes: removing a native oxide film and adhering silicon nitrides on a surface of a member made of Si based crystal on a Si based substrate in hydrogen gas atmosphere under a condition in which a pressure is a first pressure and a temperature is a first temperature, a silicon nitride-containing member being formed on the Si based substrate; lowering the temperature to a second temperature from the first temperature while maintaining the pressure at the first pressure in hydrogen gas atmosphere; lowering the pressure to a second pressure from the first pressure while maintaining the temperature at the second temperature in hydrogen gas atmosphere; and epitaxially growing a crystal on the surface of the member made of Si based crystal in a precursor gas atmosphere after the pressure is lowered to the second pressure, the crystal including at least one of Si and Ge, the precursor gas atmosphere including at least one of hydrogen, Si and Ge.

DETAILED DESCRIPTION

Embodiment

Figure 1:
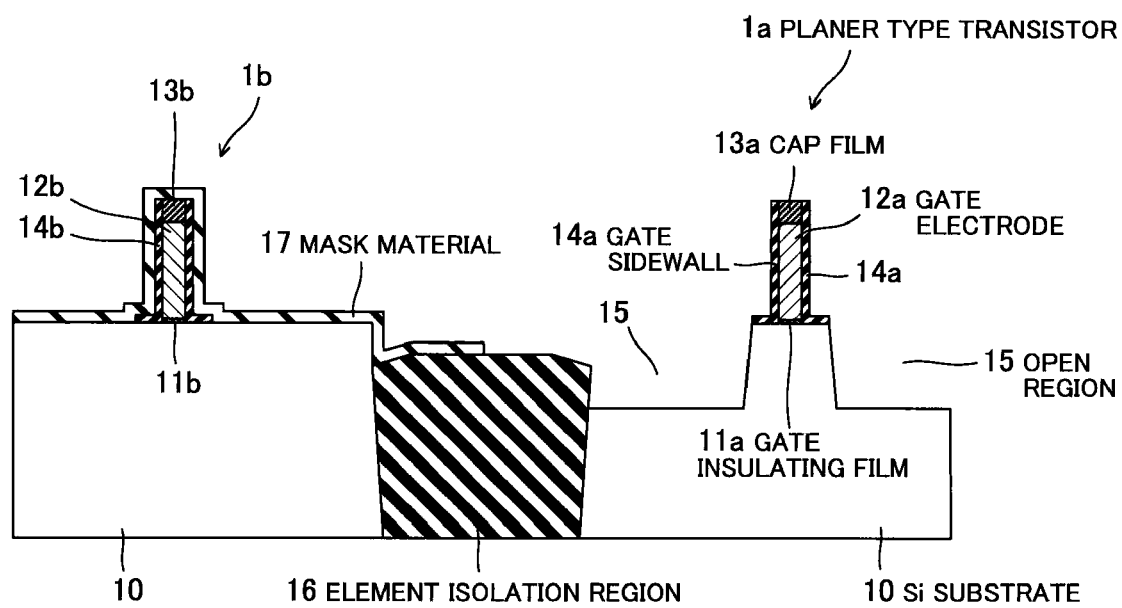
FIG. 1 is a cross-sectional view of a typical structure of a Si substrate according to a specific example of an embodiment.

This embodiment includes a method of growing a Si based crystal or a Ge based crystal on a Si based substrate provided with a member comprising silicon nitride. The method contains a cleaning process in which native oxides and silicon nitrides on a surface of the Si based substrate are removed, and a crystal growth process in which the Si based crystal or the Ge based crystal is epitaxially grown using the cleaned area of the Si substrate as a base.

Here, the Si based substrate is a substrate made of a crystal consisting mainly of Si, such as a Si substrate, etc. The Si based substrate in this embodiment comprises relatively a lot of materials made of silicon nitride at the stage of growing the Si based crystal or the Ge based crystal on the Si based substrate. This member made of silicon nitride is, for example, a mask material made of silicon nitride such as SiN and SiCN used for masking one conductivity type (which is n-type or p-type) transistor when the Si based crystal or the Ge based crystal is grown in the area of the other conductivity type transistor. Moreover, the material made of nitride is located not only on the surface of one side of the Si based substrate, on which the Si based crystal or the Ge based crystal is grown, but also on the surface of the other side of that.

Moreover, the Si based crystal is a crystal consisting mainly of Si such as Si crystal, SiGe crystal, SiC crystal, and SiGeC crystal, and the Ge based crystal is a crystal consisting mainly of Ge such as Ge crystal.

In the cleaning process, native oxide films and the silicon nitrides on the surface of the Si based substrate are removed in reduction atmosphere of hydrogen gas under the condition in which a pressure is a first pressure (100-600 Torr) and a temperature is a first temperature (800-900° C.).

After the cleaning process, a process, in which the temperature is lowered to a second temperature that is lower than the first temperature from the first temperature while maintaining the pressure at the first pressure in hydrogen gas atmosphere, is carried out, and then a process, in which the pressure is lowered to a second pressure that is lower than the first pressure from the first pressure while maintaining the temperature at the second temperature in hydrogen gas atmosphere, is carried out. After that, the crystal growth process is carried out.

The crystal growth process is a process in which a crystal, such as Si based crystal or Ge based crystal, including at least one of Si and Ge is epitaxially grown on the surface of the Si based substrate by exposing the Si based substrate into hydrogen gas atmosphere and precursor gas atmosphere including at least one of Si and Ge under the condition in which the pressure is the second pressure, and the temperature is the second temperature.

A crystal growth pressure in the crystal growth process may be different from the second pressure. In this case, after the process in which pressure is lowered to the second pressure from the first pressure, the pressure is preferably changed from the second pressure into the crystal growth pressure before the crystal growth process.

Moreover, a crystal growth temperature in the crystal growth process may be different from the second temperature. In this case, after the process in which pressure is lowered to the second pressure from the first pressure, the temperature is preferably changed from the second temperature into the crystal growth temperature before the crystal growth process.

Source gas as follows next can be used to grow Si based crystal (for instance, Si crystal, SiGe crystal, or SiC crystal) or Ge based crystal (for instance, Ge crystal). Monosilane ($SiH_4$), disilane ($Si_2H_6$), trisilane ($Si_3H_8$), monochlorosilane ($SiH_3Cl$), dichlorosilane ($SiH_2Cl_2$), trichlorosilane ($SiHCl_3$), or tetrachlorosilane ($SiCl_4$), etc. can be used as a source gas of Si. Moreover, monogermane ($GeH_4$), digermane ($Ge_2H_6$), or trigermane ($Ge_3H_8$), etc. can be used as a source gas of Ge. Moreover, monomethylsilane ($SiH_3CH_3$), dimethylsilane ($SiH_2(CH_3)_2$), trimethylsilane ($SiH(CH_3)_3$), or acetylene ($C_2H_2$), etc. can be used as a source gas of C.

A specific example of this embodiment is shown as follows. In this specific example, a 70 nm thickness SiGe crystal containing 20 atomic % of Ge is grown on open regions on both sides of a gate electrode on the Si substrate with a mask material, and, in addition, a 20 nm thickness SiGe crystal containing 5 atomic % of Ge (hereafter, it is noted as "low concentrated SiGe crystal") is grown thereon. Note that, this embodiment is not limited to the following specific example.

FIG. 1 is a cross-sectional view of a typical structure of the Si substrate in this specific example. In a right area in FIG. 1 of a Si substrate 10 on which a planer type transistor 1a is formed, open regions 15 for growth of SiGe crystal are formed on both sides of a gate insulating film 11a, a gate electrode 12a, a cap film 13a and gate sidewalls 14a in the Si substrate 10. On the other hand, in a left area, which is separated from the right area by the element isolation region 16, in FIG. 1 of a Si substrate 10 on which a planer type transistor 1b is formed, a mask material 17 is formed on the Si substrate 10, a gate insulating film 11b, a gate electrode 12b, a cap film 13b, and gate sidewalls 14b, thereby suppressing a growth of the SiGe crystal in this area.

The Si substrate 10 as Si based substrate is single crystal substrate of which the principal surface is (100). In this case, the plane direction on a surface located in the side face of open regions 15 of the Si substrate 10 is, for instance, (110). (110) surface is more easily polluted by the dispersing silicon nitride than (100) surface, and has a tendency that the crystal defect occur easily by the pollution. Therefore, in case of growing crystal on (110) surface, it is more important to suppress the pollution of the Si substrate, and this embodiment makes remarkable effect.

Moreover, surface layers of the gate sidewall 14a and 14b are made of SiN. Moreover, the mask material 17 is made of SiN. Moreover, the element isolation region 16 is made of $SiO_2$. Moreover, the coverage of silicon nitride including the mask material 17 on the Si based substrate 10 is about 60%, and the coverage of Si oxide including the element isolation region 16 is about 25%.

Figure 2A:
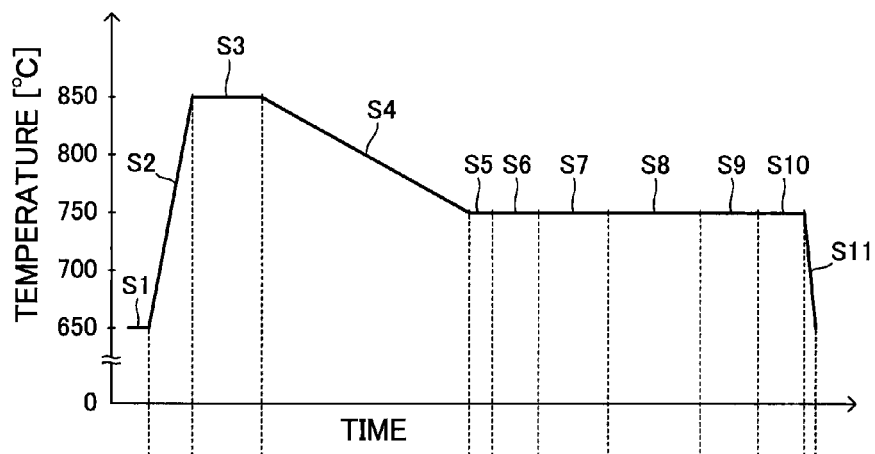
FIGS. 2A is a graph showing a process sequence in the specific example.
Figure 2B:
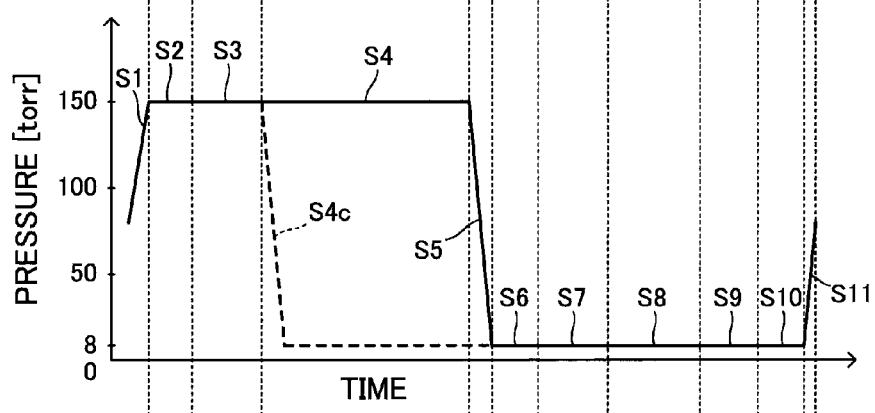
FIGS. 2B is a graph showing a process sequence in the specific example.
Figure 2C:
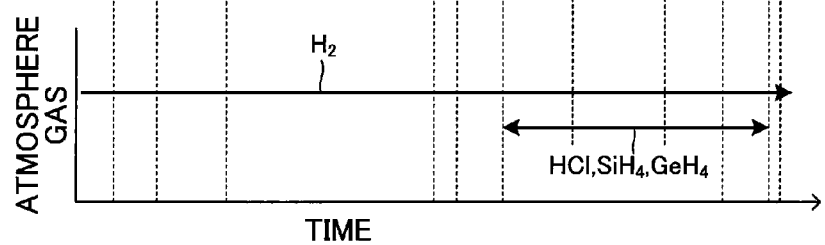
FIGS. 2C is a graph showing a process sequence in the specific example.

FIGS. 2A to 2C are graphs showing a process sequence in the specific example. A polygonal curve on FIG. 2A shows variations in temperature conditions over time. Moreover, a polygonal curve on FIG. 2B shows variations in pressure conditions over time. Moreover, the arrow lines on FIG. 2C show timings at which hydrogen ($H_2$) gas, hydrogen chloride (HCl) gas, monosilane gas, and monogermane gas are flowed, respectively.

Here, a step S3 in the figures corresponds to the above-mentioned cleaning process. Moreover, steps of S7-S10 in the figures correspond to the crystal growth process, and monosilane is used as a source gas of Si and monogermane is used as a source gas of Ge.

FIG. 2A to 2C show a typical example of a process sequence when the crystal growth pressure and the crystal growth temperature are respectively the second pressure and the second temperature in the crystal growth process. In this case, the second pressure is 5-20 Torr which is appropriate for epitaxial growth of Si based crystal or Ge based crystal. Moreover, the second temperature is 550-775° C. which is appropriate for epitaxial growth of Si based crystal or Ge based crystal.

Although the second temperature may be different from the crystal growth temperature, it should be 775° C. or less to suppress dispersion of silicon nitrides after the cleaning process.

Moreover, although the second pressure may be different from the crystal growth pressure, it should be preferably near to the pressure of crystal growth pressure to shift smoothly to crystal growth process, and it is preferably in the range of 5-20 Torr.

Firstly, a pre-treatment is applied to the Si substrate 10 shown in FIG. 1 using hydrogen fluoride diluted to 1% to remove a native oxide film on a surface of Si and to terminate the surface of Si by hydrogen atoms.

Next, after the Si substrate 10 is transported into a single wafer type deposition chamber which is heated to 650° C. in an atmosphere of pressure not more than 100 Torr, pressure is set to the first pressure (100-600 Torr) under a condition in which 25 slm of hydrogen gas is flowed (step S1). Here, the hydrogen gas is a gas used for removing a native oxide film and silicon nitrides on the inner surface of the open regions 15 of Si substrate 10. Note that, nitrogen gas or argon gas etc. may be used instead of the hydrogen gas.

Note that, FIG. 2B shows a process sequence as an example when a pressure during the transportation of Si substrate 10 into the deposition chamber is 80 Torr and the first pressure is 150 Torr.

The reason why the Si substrate 10 is transported into the deposition chamber in the depressed atmosphere at 100 Torr or less is as follows. The deposition chamber of the epitaxial growth system is a load lock chamber in general which has structure that atmosphere can not be brought in. Moreover, inert gas, and in particular, nitrogen gas is often used as atmosphere when the Si substrate is transported in the chamber in many cases. Therefore, it becomes easy for nitrogen in atmosphere to adhere to the surface of the Si substrate when the pressure during transportation of the Si substrate into the chamber is too high. Then, the Si substrate is transported in the depressed atmosphere at 100 Torr or less that is enough low pressure.

Next, the temperature of the chamber is raised up to the first temperature (800-900° C.) (step S2), and is kept for 60 seconds to remove a native oxide film and silicon nitride on the inner surfaces of open regions 15 of the Si substrate 10 (step S3). Pressure in the chamber is kept to the first pressure during step S2 and S3. The process sequence when the first temperature is assumed to be 850° C. is shown in FIG. 2A as an example.

Next, the temperature of the chamber will be lowered up to the second temperature (550-775° C.) in 180 seconds (step S4). Pressure in the chamber is kept to the first pressure during step S4. The process sequence when the second temperature is assumed to be 750° C. is shown in FIG. 2A as an example.

Next, a hydrogen flow rate is lowered to 12 slm while maintaining the temperature of the chamber at the second temperature, and the pressure is lowered to the second pressure (5-20 Torr) (step S5). The process sequence when the second pressure is assumed to be 8 Torr is shown in FIG. 2B as an example.

Note that, step S4c in FIG. 2B is a step generally used instead of step S4 of this embodiment in a conventional process (the variations in temperature conditions of FIG. 2A is the same as step S4). In step S4c, the pressure begins to be lowered at the same time as the beginning of lowering the temperature, and is kept at the second pressure until the temperature reaches at the second temperature.

Next, the temperature and the pressure are respectively kept the second temperature and the second pressure for 60 seconds to stabilize the temperature in the chamber (step S6).

Next, hydrogen chloride gas, monosilane gas, and monogermane gas are flowed at the rate of 120 sccm, 50 sccm, and 50 sccm respectively, which are kept for 60 second while maintaining the temperature at the second temperature and while maintaining the pressure at the second pressure, and an epitaxial growth of the SiGe crystal in open regions 15 of the Si substrate 10 is begun (step S7). The growth rate of this SiGe crystal is 5 nm/min.

Next, monogermane flow rate is raised to 308 sccm for 80 seconds (step S8), and then is kept for 50 seconds to form SiGe crystal (step S9).

Next, flow rates of hydrogen chloride, monosilane and monogermane are respectively changed to 160 sccm, 80 sccm and 60 sccm to begin a growth of the low concentrated SiGe layer (step 10).

Next, after 10 seconds, the supplies of hydrogen chloride, monosilane and monogermane are stopped, and the pressure is raised up to 80 Torr while decreasing the temperature to the vicinity of 650° C. (step 11), and then the Si substrate 10 is taken out of the chamber.

When Si crystal is grown instead of the SiGe crystal, for instance, the use of monogermane is omitted in the crystal growth process (steps S7-S10) in the above-mentioned specific example. Moreover, when Ge crystal is grown, for instance, the use of monosilane is omitted. Moreover, when SiC crystal is grown, for instance, monometylesilane is used instead of monogermane.

Figure 3A:
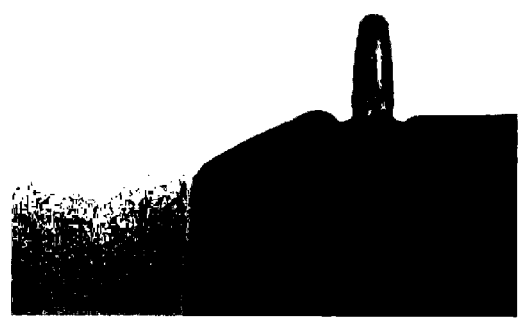
FIG. 3A is a STEM photograph of a SiGe crystal formed on a Si substrate on the basis of the specific example of the embodiment.
Figure 3B:
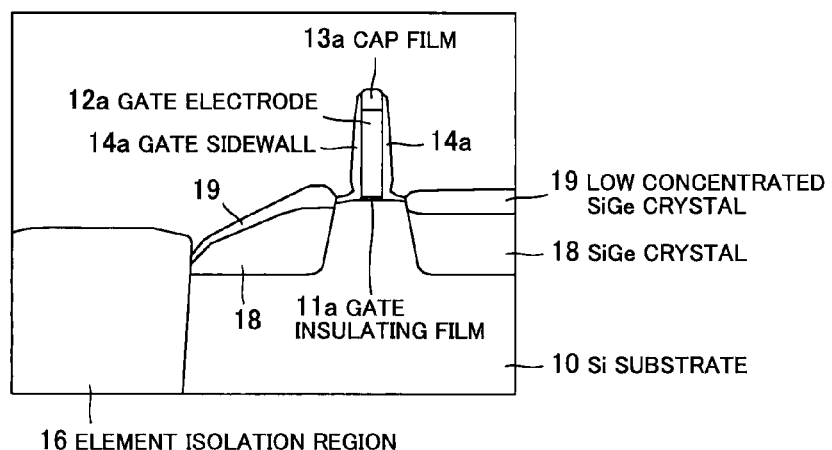
FIG. 3B is an outline of the STEM photograph in FIG. 3A.

FIG. 3A is a STEM (scanning transmission electron microscope) photograph of the SiGe crystal formed on the Si substrate on the basis of the above-mentioned specific example. Moreover, FIG. 3B shows an outline of the STEM photograph in FIG. 3A.

Figure 4A:
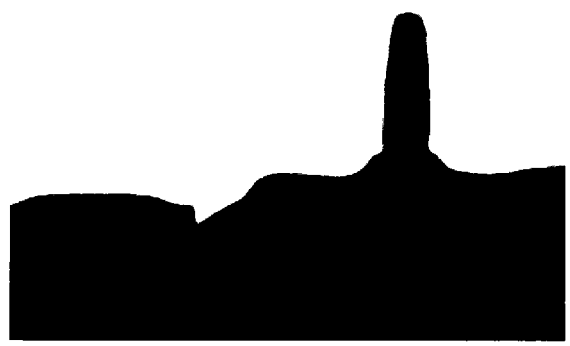
FIG. 4A is a STEM photograph of a SiGe crystal on a Si substrate prepared as a comparative example.
Figure 4B:
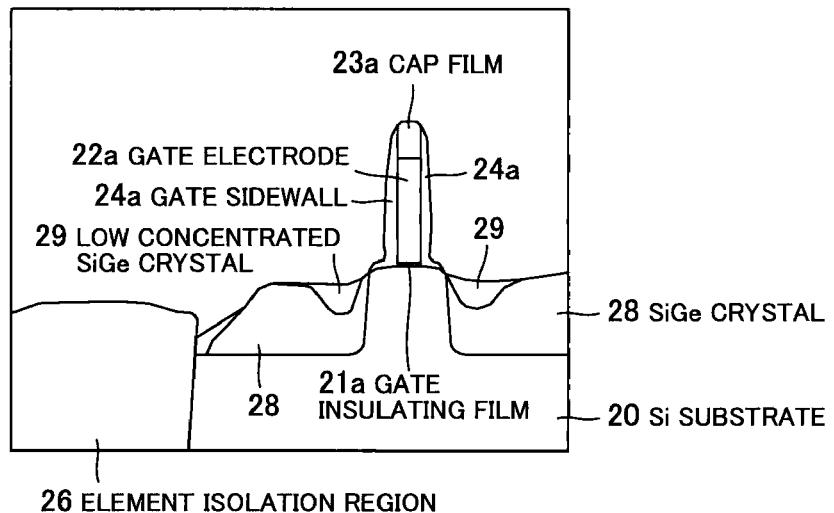
FIG. 4B is an outline of the STEM photograph in FIG. 4A.

Moreover, FIG. 4A is a STEM photograph of a SiGe crystal on a Si substrate prepared as a comparative example. Moreover, FIG. 4B shows an outline of the STEM photograph in FIG. 4A. Here, SiGe crystal 28 and low concentrated SiGe crystal 29 are crystals which are formed under a condition in which the pressure condition in step S4c is used instead of the pressure condition in step S4 in FIG. 2B (other conditions are the same).

A Si substrate 20, a gate insulating film 21a, a gate electrode 22a, a cap film 23a, a gate sidewall 24a, and an element isolation region 26 correspond to the Si substrate 10, the gate insulating film 11a, the gate electrode 12a, the cap film 13a, the gate sidewall 14a, and the element isolation region 16 respectively.

A SiGe crystal 18 and a low concentrated SiGe crystal 19 of FIG. 3A are selectively formed in open regions 15 of the Si substrate 10. Moreover, the SiGe crystal 28 and the low concentrated SiGe crystal 29 in FIG. 4A are selectively formed in open regions of the Si substrate 20 corresponding to the open regions 15.

According to FIGS. 3A, 3B, 4A and 4B, it is confirmed that the SiGe crystal 18 and the low concentrated SiGe crystal 19, which are formed through the cleaning process and the crystal growth process of this embodiment, have less roughness and better crystallinity than the SiGe crystal 28 and the low concentrated SiGe crystal 29 in the comparative example.

Figure 5A:
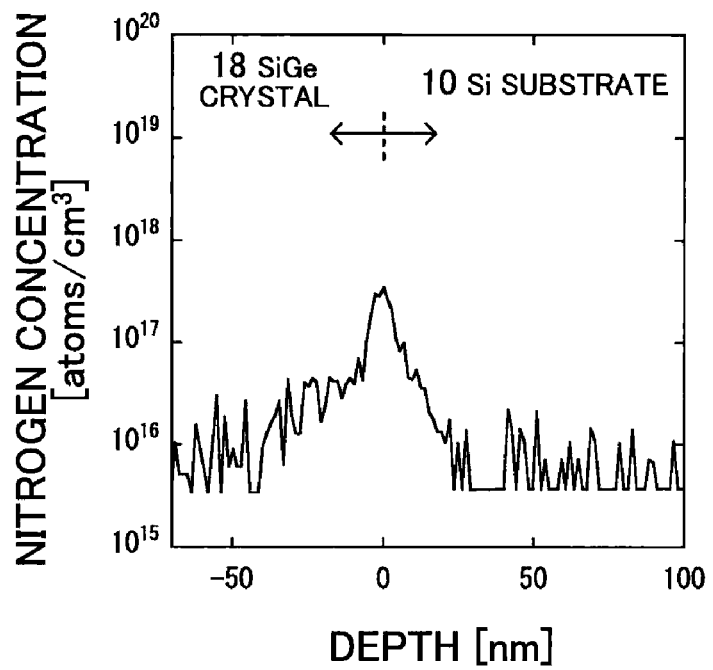
FIG. 5A shows a SIMS profile of a nitrogen concentration in the vicinity of a interface between a Si substrate according to the embodiment and a SiGe crystal.
Figure 5B:
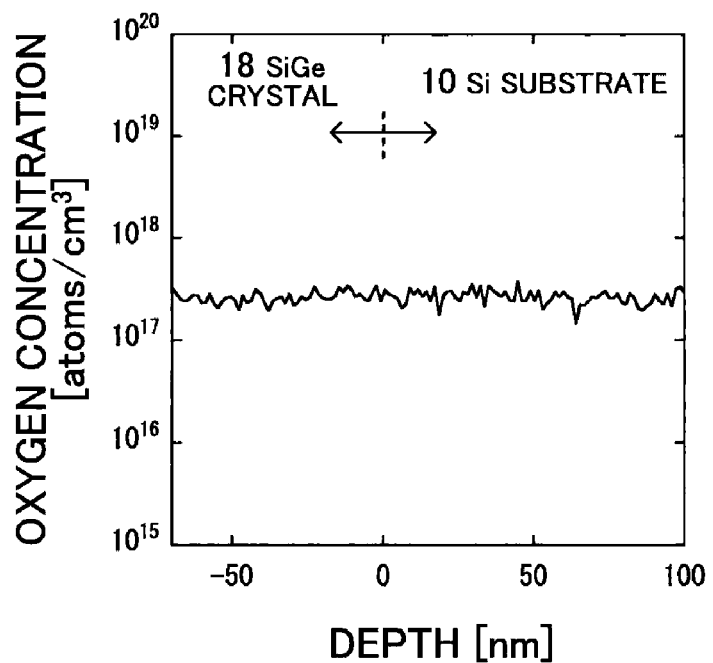
FIG. 5B shows a SIMS profile of an oxygen concentration in the vicinity of a interface between a Si substrate according to the embodiment and a SiGe crystal.

FIGS. 5A and 5B show SIMS (Secondary Ion Mass Spectrometry) profiles of a nitrogen concentration and an oxygen concentration in the vicinity of the interface between the Si substrate 10 and the SiGe crystal 18 (which is bottom in the open regions 15 of the Si substrate 10). Each vertical axis of FIGS. 5A and 5B represents concentration (atoms/cm$^3$) of each element, and each horizontal axis thereof represents depth (nm) in a vertical direction to the surface of the Si substrate 10 when the depth of the interface between the Si substrate 10 and SiGe crystal 18 is defined as 0.

Figure 6A:
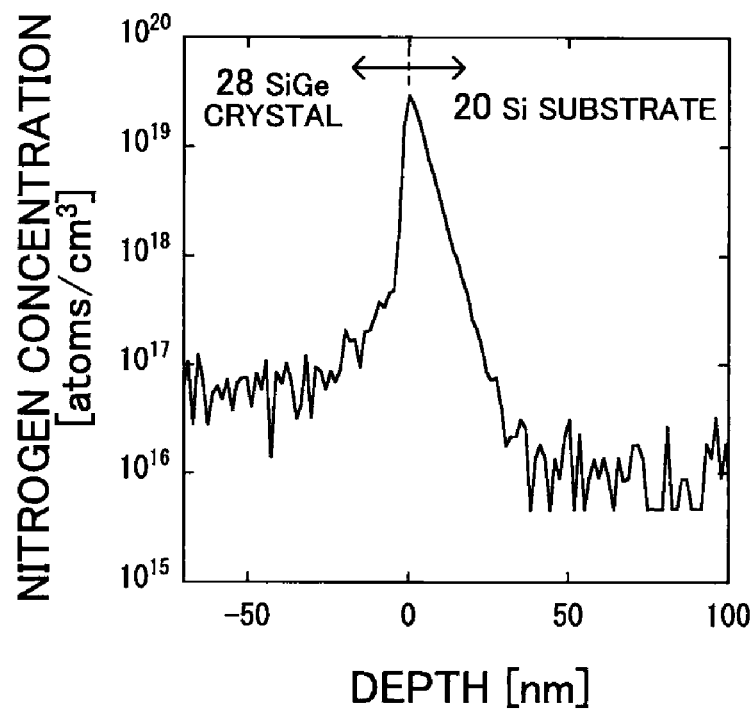
FIG. 6A shows a SIMS profile of a nitrogen concentration in the vicinity of the interface between a Si substrate prepared as a comparative example and a SiGe crystal.
Figure 6B:
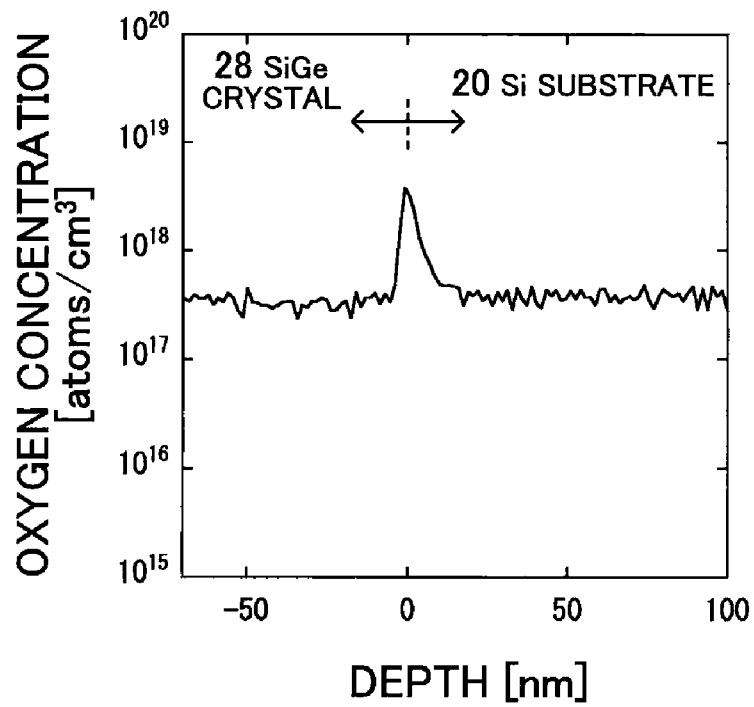
FIG. 6B shows a SIMS profile of an oxygen concentration in the vicinity of the interface between a Si substrate prepared as a comparative example and a SiGe crystal.
Figure 7:
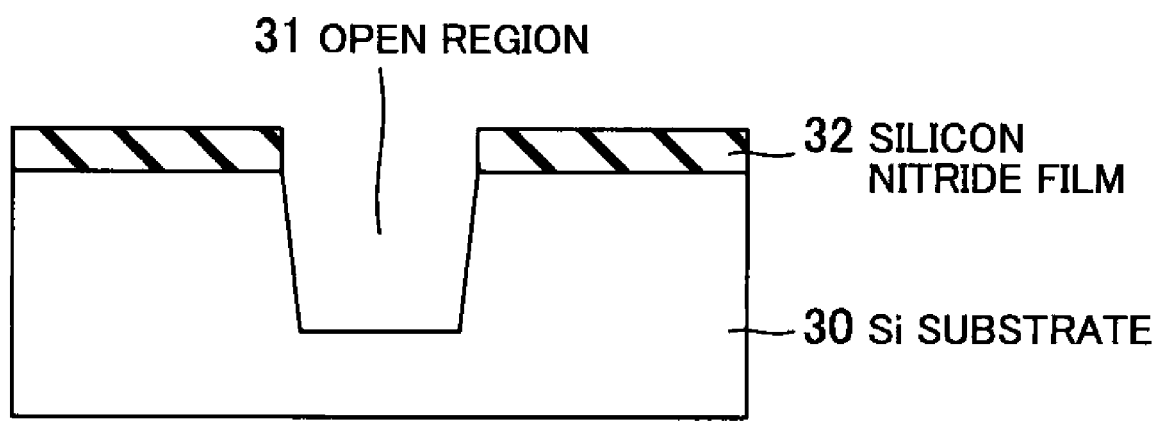
FIG. 7 shows a Si substrate prepared in order to verify effects of the embodiment.

FIGS. 6A and 6B show SIMS profiles of a nitrogen concentration and an oxygen concentration in the vicinity of the interface between the Si substrate 20 and the SiGe crystal 28 (which is bottom in the open regions of the Si substrate 20). Each vertical axis of FIGS. 6A and 6B represents concentration (atoms/cm$^3$) of each element, and each horizontal axis represents depth (nm) in a vertical direction to the surface of the Si substrate 10 when the depth of the interface between the Si substrate 20 and the SiGe crystal 28 is defined as 0.

The nitrogen concentration (atoms/cm$^3$) in the vicinity of the interface between the Si substrate 10 and the SiGe crystal 18 shown in FIG. 5A is integrated over the depth represented by the horizontal axis, and a nitrogen concentration (atoms/cm$^2$) in the vicinity of the interface is thereby determined to be $4.2 \times 10^{11}$ atoms/cm$^2$. Moreover, the nitrogen concentration (atoms/cm$^3$) in the vicinity of the interface between the Si substrate 20 and the SiGe crystal 28 shown in FIG. 6A is integrated over the depth represented by the horizontal axis, and a nitrogen concentration (atoms/cm$^2$) in the vicinity of the interface is thereby determined to be $4.5 \times 10^{13}$ atoms/cm$^2$.

According to those results, it is revealed that a nitrogen concentration (atoms/cm$^2$) in the vicinity of the interface between the Si substrate 10 and the SiGe crystal 18 is lower than that in the vicinity of the interface between the Si substrate 20 and the SiGe crystal 28, silicon nitrides on the inner surface of the open regions 15 of Si substrate 10 is effectively removed by the cleaning process of this embodiment, and dispersion of silicon nitride from the mask material 17 etc. after the cleaning process is effectively suppressed. Moreover, the oxygen concentration (atoms/cm$^3$) in the vicinity of the interface between the Si substrate 20 and the SiGe crystal 28 shown in FIG. 6B is integrated over the depth represented by the horizontal axis, and an oxygen concentration (atoms/cm$^2$) in the interface is thereby determined to be $4.2 \times 10^{12}$ atoms/cm$^2$. Moreover, FIG. 5B shows that oxygen is hardly contained in the vicinity of the interface between the Si substrate 10 and the SiGe crystal 18.

According to these results, it is revealed that the oxygen concentration (atoms/cm$^2$) in the interface between the Si substrate 10 and the SiGe crystal 18 is lower than that in the interface between the Si substrate 20 and the SiGe crystal 28, and a native oxide film on the inner surface of the open regions 15 of the Si substrate 10 is effectively removed by the cleaning process of this embodiment.

Coverages of silicon nitride and silicon oxide on the Si based substrate 10 and 20 are 60% and 25% respectively when the SiGe crystals 18 and 28 and the low concentrated SiGe crystals 19 and 29 are grown. Although the coverage of silicon nitride or silicon oxide is different from these, the result is the same as above mentioned result.

Here, the Si substrate 30 had an open region 31, and areas other than the open region 31 on the Si substrate 30 were covered with a silicon nitride film 32. A SiGe crystal is selectively formed in the open region 31. Note that, coverage of the silicon nitride film 32 on the Si substrate 30 was 95%.

Figure 8A:
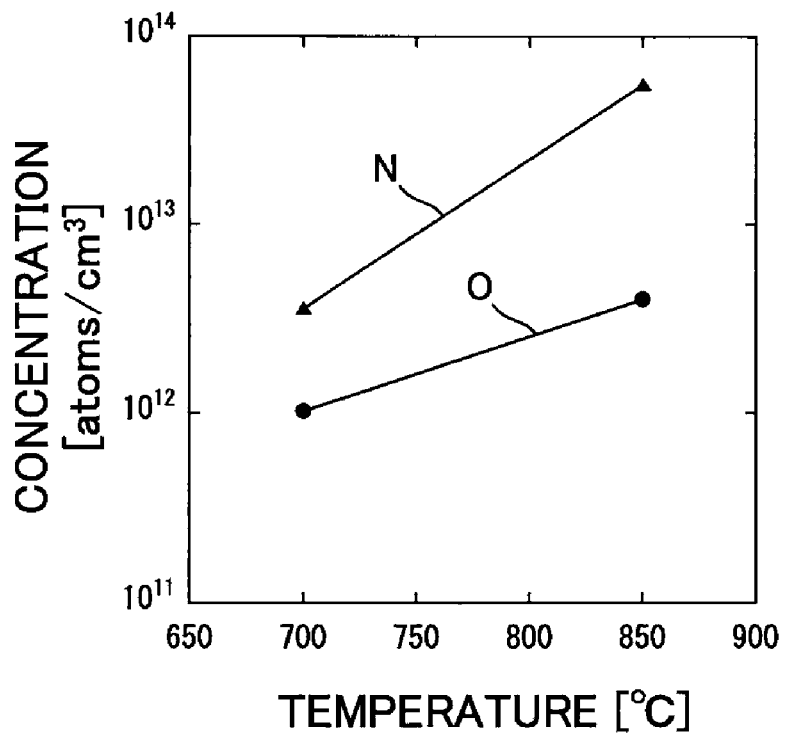
FIG. 8A shows a result of the verification of the Si substrate shown in FIG. 7 for the verification of the embodiment.

FIG. 8A is a graph which shows hydrogen heat-treatment temperature dependences of a nitrogen concentration and an oxygen concentration in the vicinity of the interface between the Si substrate 30 and the SiGe crystal when the SiGe crystal is grown in the open region 31 after hydrogen heat-treatment under conditions in which a temperature is 700° C. or 850° C. and a pressure is 10 Torr.

FIG. 8A shows that a nitrogen concentration, when the hydrogen heat-treatment temperature is 700° C. or 850° C., is $3.6 \times 10^{12}$ or $5.6 \times 10^{13}$ atoms/cm$^2$, and that an oxygen concentration when the hydrogen heat-treatment temperature is 700° C., or 850° C. is $1.0 \times 10^{12}$ or $4.0 \times 10^{12}$ atoms/cm$^2$. According to these results, it was confirmed that a native oxide film and silicon nitrides remain in the vicinity of the interface between the Si substrate 30 and the SiGe crystal with undesirable amount in these temperature conditions under the decompression atmosphere in which pressure is not more than 10 Torr.

According to these results, it is found that a lot of silicon nitrides are dispersed from the mask material etc. after the cleaning process when the pressure is lowered to 10 Torr or less without enough lowering of the temperature from the first temperature after the cleaning process in this embodiment, that is, when step S4c shown in FIG. 2B is used. On the other hand, if step S4 in this embodiment is used, the dispersion of silicon nitrides from the mask material etc. after the cleaning process can be effectively suppressed since the pressure begins to be lowered after the temperature is lowered to the second temperature.

Figure 8B:
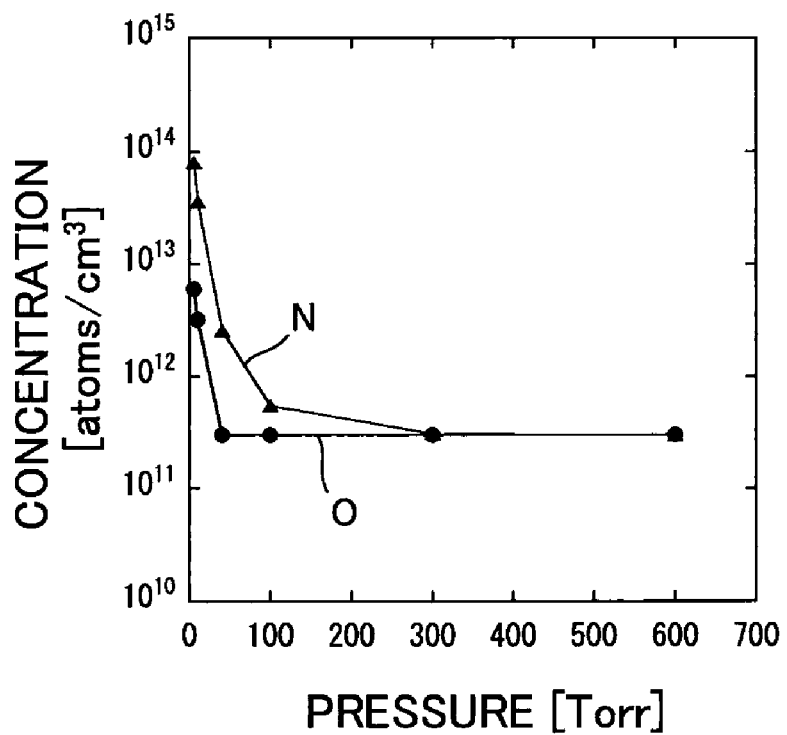
FIG. 8B shows a result of the verification of the Si substrate shown in FIG. 7 for the verification of the embodiment.

FIG. 8B is a graph showing a nitrogen concentration and an oxygen concentration in the vicinity of the interface between the Si substrate 30 and the SiGe crystal with respect to the first pressure in the cleaning process when the method of crystal growth shown in FIGS. 2A to 2C of this embodiment is applied to the SiGe crystal grown on the Si substrate 30. Note that, the first temperature in the cleaning process was set to 850° C.

FIG. 8B shows that a nitrogen concentration, when the first pressure is 5, 10, 40, 100, or 300 Torr, is $8 \times 10^{13}$, $3.6 \times 10^{13}$, $2.6 \times 10^{12}$, $5.5 \times 10^{11}$, and $3.1 \times 10^{11}$ atoms/cm$^2$ and that a nitrogen concentration when the first pressure is 600 Torr is not more than $3.0 \times 10^{11}$ atoms/cm$^2$ which is the detection limiting density.

Moreover, FIG. 8B shows that an oxygen concentration, when the first pressure is 5 or 10 Torr, is $6.0 \times 10^{12}$ or $3.2 \times 10^{12}$ atoms/cm$^2$, and that an oxygen concentration when the first pressure is 40-600 Torr, is not more than $3.0 \times 10^{11}$ atoms/cm$^2$ which is the detection limiting density.

According to these results, it was confirmed that a native oxide film and silicon nitrides on the inner surface of the open region 31 of the Si substrate 30 can be removed enough when the first pressure is set to 100 Torr or more in the cleaning process. However, it is undesirable to set a pressure of the hydrogen heat-treatment to 600 Torr or more. This is because, a decompression deposition device growing crystalline film under condition with pressure from several Torr to several tenth of Torr, that it is difficult to steady control pressure in the vicinity of the atmospheric pressure or more and that there is a possibility of leakage of used hydrogen gas.

In general, an amount of dispersion of silicon nitrides from a mask material at hydrogen heat treatment increases with increasing in a coverage of silicon nitrides on Si substrate, and an amount of silicon nitrides adhering on an inner surface of a open region thereby increases. However, according to the result shown in FIG. 8B, although a Si substrate is covered with silicon nitrides at high rate coverage of 95%, a native oxide film and silicon nitrides can be removed enough. Therefore, the crystal growth method of this embodiment is an effective technique for crystal growth on substrates on which a pattern of the silicon nitride films is formed with various coverages. Note that, of course, even if coverage of silicon nitrides on a Si substrate is other than 95%, the effect of this embodiment is similarly produced.

Figure 9:
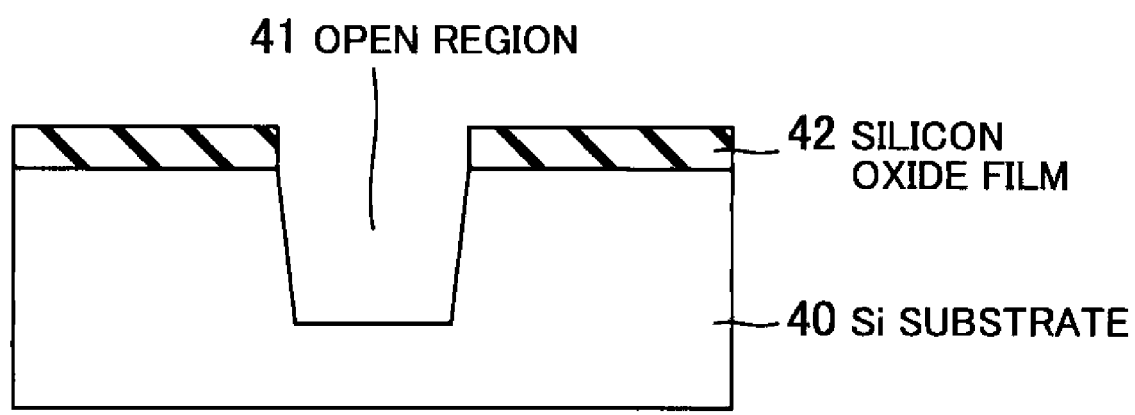
FIG. 9 shows a Si substrate prepared in order to verify effects of the embodiment.

Furthermore, in order to verify the effects of this embodiment, a Si substrate 40 shown in FIG. 9 was prepared, and then the relation between the oxygen concentration, which is in the vicinity of the interface between the Si substrate 40, and a SiGe crystal and the pressure in the cleaning process of this embodiment was investigated.

Here, the Si substrate 40 had an open region 41, and areas other than the open region 41 on the Si substrate 40 were covered with a silicon oxide film 42. A SiGe crystal is selectively formed in the open region 41.

Figure 10:
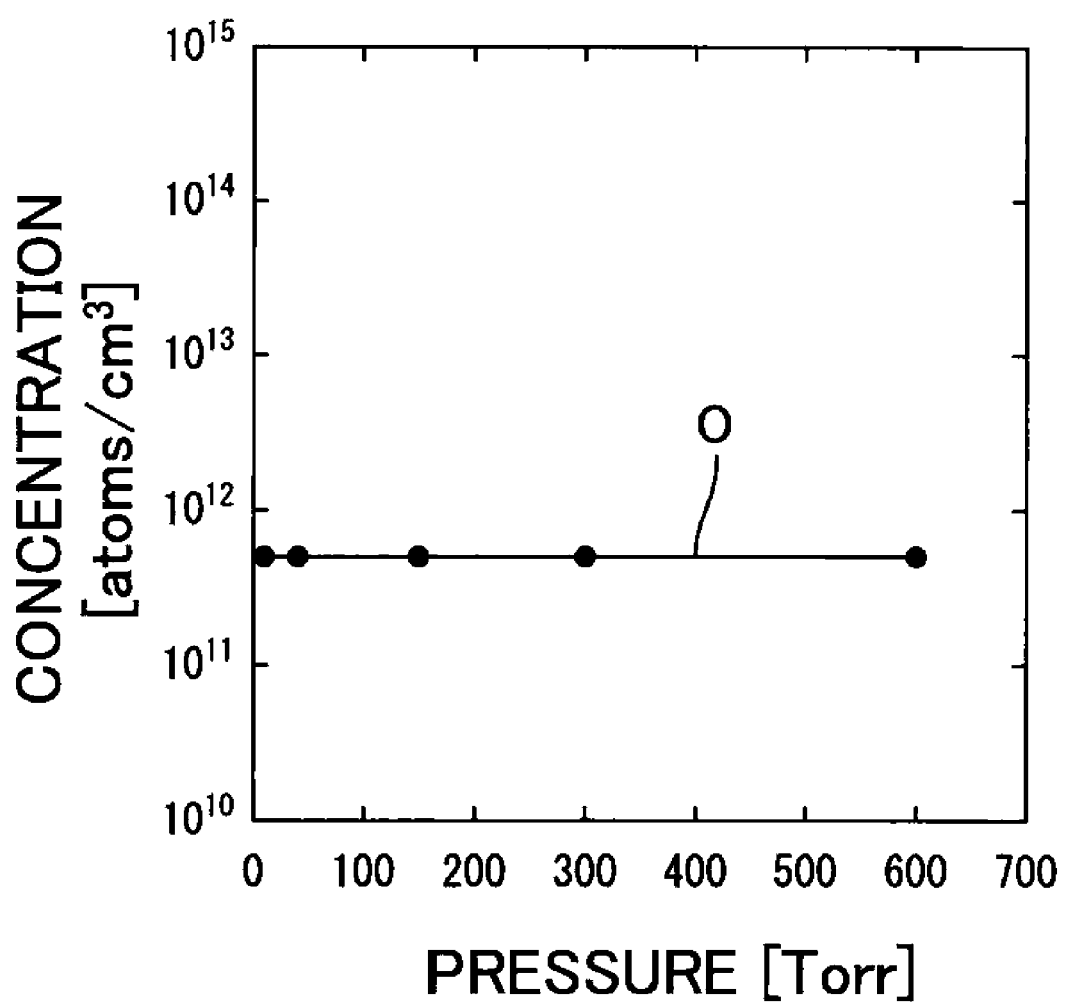
FIG. 10 shows result of the verification of the Si substrate shown in FIG. 9 for the verification of the embodiment.

FIG. 10 is a graph showing the oxygen concentration in the vicinity of the interface between the Si substrate 40 and the SiGe crystal with respect to the first pressure in the cleaning process when the method of crystal growth shown in FIGS. 2A to 2C of this embodiment is applied to the SiGe crystal grown on the Si substrate 40. Note that, the first temperature in the cleaning process was set at 850° C.

FIG. 10 shows that oxygen concentrations when the first pressure is 10-600 Torr is not more than $5.0 \times 10^{11}$ atoms/cm² which is the detection limiting concentration.

As a result, it was confirmed that a native oxide film on the inner surface of the open region 41 of the Si substrate 40 was removed enough regardless of the value of the first pressure when the method of crystal growth shown in FIGS. 2A to 2C of this embodiment was applied to crystal growth on the Si substrate covered with a silicon oxide film. Moreover, the same result was obtained in the range of 800-900° C., though the first temperature was other than 850° C.

From the above-mentioned results, it was confirmed that a native oxide film and silicon nitrides in an open region in a Si substrate covered with a silicon nitride film or a silicon oxide film can be effectively removed by setting the first pressure in this embodiment to 100-600 Torr.

Effect of the Embodiment

According to the embodiment, although there are comparatively a lot of members made of silicon nitride such as a mask material etc. on a Si based substrate when a Si based crystal or a Ge based crystal is epitaxially grown on the Si based substrate, a native oxide film and adhering silicon nitrides on an area used for a base of the epitaxial growth on the Si substrate are effectively removed in the cleaning process, and furthermore, after the cleaning process, it can be effectively suppressed that silicon nitrides disperse from the mask material etc. and adhere on the area used for the base of the epitaxial growth after the cleaning process. As a result, the Si based crystal or the Ge based crystal with good crystallinity can be grown on the Si substrate.

Other Embodiments

It should be noted that the present invention is not intended to be limited to the above-mentioned embodiment, and the various kinds of changes thereof can be implemented by those skilled in the art without departing from the gist of the invention. For example, the present invention can be applied to epitaxial growth of a Si based crystal or a Ge based crystal on a surface of a member made of Si based crystal such as a fin of a fin type transistor.

Figure 11A:
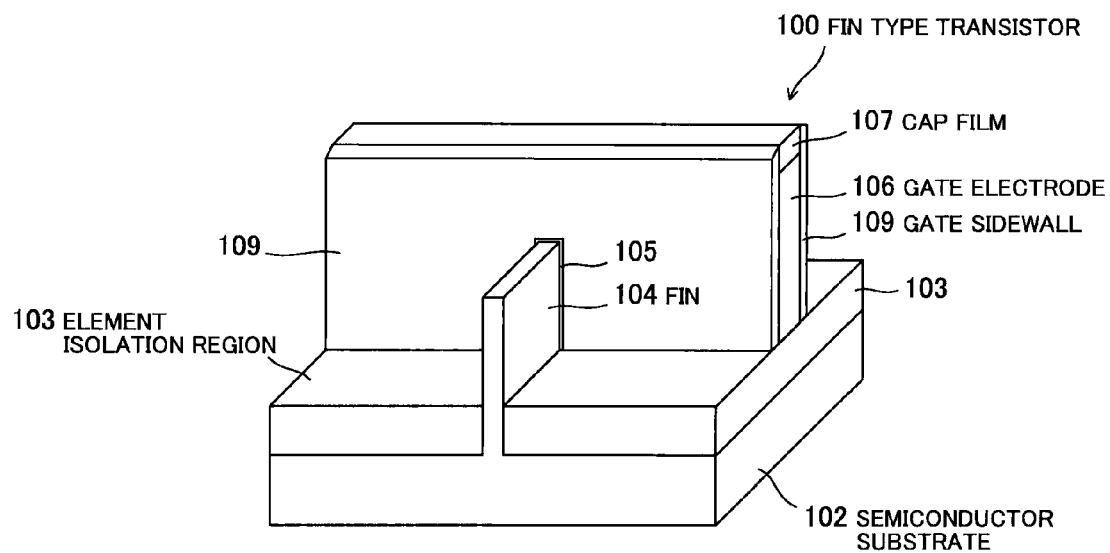
FIG. 11A is a perspective view of a typical structure of a fin type transistor according to a specific example of another embodiment.
Figure 11B:
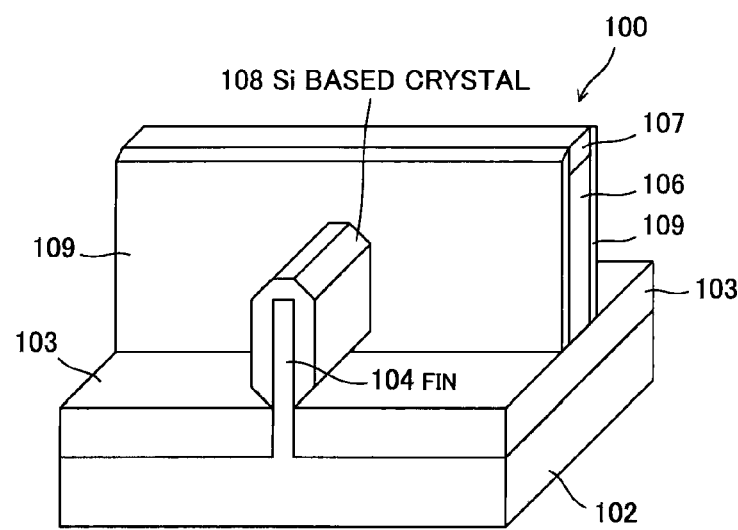
FIG. 11B is a perspective view of a typical structure of a fin type transistor according to a specific example of another embodiment.

FIGS. 11A and 11B are perspective views showing a situation that a Si based crystal 108 is epitaxially grown on surfaces of a fin 104 of a fin type transistor 100.

FIG. 11A shows the fin type transistor 100 before the Si based crystal 108 is epitaxially grown on the surfaces of the fin 104. the fin type transistor 100 includes the fin 104 formed on a semiconductor substrate 102, a gate electrode 106 contacting both side surfaces and a upper surface of the fin 104 via a gate insulating film 105, a cap film 107 formed on the gate electrode 106 and a gate sidewall 109 formed on both sides of the gate electrode 106. The fin type transistor 100 is electrically isolated from other elements on the semiconductor substrate 102 by an element isolation region 103.

The Gate sidewall 109, for example, has a single-layer structure made of silicon nitride such as SiN or a multilayered structure of which a surface layer is made of silicon nitride.

Moreover, a mask material made of silicon nitride masking non-illustrated other semiconductor elements may be on the semiconductor substrate 102.

FIG. 11B shows the fin type transistor 100 after the Si based crystal 108 is epitaxially grown on the surfaces of the fin 104. The Si based crystal 108 is formed through the same process as the steps S1-S10 shown in FIGS. 2A to 2C. That is, native oxides and silicon nitrides on the surfaces of the fin 104 are removed through the cleaning process, and then the Si based crystal 108 is epitaxially grown on the surfaces of the fin 104 through the crystal growth process. Note that, a Ge based crystal may be grown instead of the Si based crystal 108.

An electrical resistance of a source/drain region of the fin type transistor 100 can be decreased by growing the Si based crystal 108 on the surfaces of the fin 104.

What is claimed is:

1. A method of fabricating a semiconductor device, comprising:
   removing a native oxide film and adhering silicon nitrides on an area of a Si based substrate in hydrogen gas atmosphere under a condition in which a pressure is a first pressure and a temperature is a first temperature, a silicon nitride-containing member being formed on the Si based substrate, the area being a area not covered by the member;
   lowering the temperature to a second temperature from the first temperature while maintaining the pressure at the first pressure in hydrogen gas atmosphere;
   lowering the pressure to a second pressure from the first pressure while maintaining the temperature at the second temperature in hydrogen gas atmosphere; and
   epitaxially growing a crystal on the area of the Si based substrate in a precursor gas atmosphere after the pressure is lowered to the second pressure, the crystal including at least one of Si and Ge, the precursor gas atmosphere including at least one of hydrogen, Si and Ge.

2. The method of fabricating a semiconductor device according to claim 1, wherein the first pressure is in the range of 100-600 Torr.

3. The method of fabricating a semiconductor device according to claim 1, wherein the first temperature is in the range of 800-900° C.

4. The method of fabricating a semiconductor device according to claim 2, wherein the first temperature is in the range of 800-900° C.

5. The method of fabricating a semiconductor device according to claim 1, wherein the crystal is epitaxially grown under a condition in which the pressure is the second pressure and the temperature is the second temperature.

6. The method of fabricating a semiconductor device according to claim 1, wherein the native oxide film and the adhering silicon nitrides on the area of the Si based substrate are removed after the Si based substrate is transported into a epitaxial growth system in nitrogen gas atmosphere at 100 Torr or less.

7. The method of fabricating a semiconductor device according to claim 1, wherein the Si based substrate includes a open region therein; and
   the crystal is grown in the open region.

8. The method of fabricating a semiconductor device according to claim 1, wherein the silicon nitride-containing member includes at least one of a gate sidewall and a mask material.

9. The method of fabricating a semiconductor device according to claim 5, wherein the second pressure is in the range of 5-20 Torr.

10. The method of fabricating a semiconductor device according to claim 5, wherein the second temperature is in the range of 550-775° C.

11. A method of fabricating a semiconductor device, comprising:

removing a native oxide film and adhering silicon nitrides on a surface of a member made of Si based crystal on a semiconductor substrate in hydrogen gas atmosphere under a condition in which a pressure is a first pressure and a temperature is a first temperature, a silicon nitride-containing member being formed on the semiconductor substrate;

lowering the temperature to a second temperature from the first temperature while maintaining the pressure at the first pressure in hydrogen gas atmosphere;

lowering the pressure to a second pressure from the first pressure while maintaining the temperature at the second temperature in hydrogen gas atmosphere; and epitaxially growing a crystal on the surface of the member made of Si based crystal in a precursor gas atmosphere after the pressure is lowered to the second pressure, the crystal including at least one of Si and Ge, the precursor gas atmosphere including at least one of hydrogen, Si and Ge.

12. The method of fabricating a semiconductor device according to claim 11, wherein the member includes a fin of a fin type transistor.

13. The method of fabricating a semiconductor device according to claim 11, wherein the first pressure is in the range of 100-600 Torr.

14. The method of fabricating a semiconductor device according to claim 11, wherein the first temperature is in the range of 800-900° C.

15. The method of fabricating a semiconductor device according to claim 13, wherein the first temperature is in the range of 800-900° C.

16. The method of fabricating a semiconductor device according to claim 11, wherein the crystal is epitaxially grown under a condition in which the pressure is the second pressure and the temperature is the second temperature.

17. The method of fabricating a semiconductor device according to claim 11, wherein the native oxide film and the adhering silicon nitrides on the surface of the member are removed after the semiconductor substrate is transported into a epitaxial growth system in nitrogen gas atmosphere at 100 Torr or less.

18. The method of fabricating a semiconductor device according to claim 11, wherein the silicon nitride-containing member includes at least one of a gate sidewall and a mask material.

19. The method of fabricating a semiconductor device according to claim 16, wherein the second pressure is in the range of 5-20 Torr.

20. The method of fabricating a semiconductor device according to claim 16, wherein the second temperature is in the range of 550-775° C.

* * * * *